United States Patent
Bykanov et al.

(10) Patent No.: US 8,633,459 B2
(45) Date of Patent: Jan. 21, 2014

(54) SYSTEMS AND METHODS FOR OPTICS CLEANING IN AN EUV LIGHT SOURCE

(75) Inventors: Alexander N. Bykanov, San Diego, CA (US); Silvia De Dea, San Diego, CA (US); Alexander I. Ershov, Escondido, CA (US); Vladimir B. Fleurov, Escondido, CA (US); Igor V. Fomenkov, San Diego, CA (US); William N. Partlo, Poway, CA (US)

(73) Assignee: Cymer, LLC, San Diego, CA (US)

( * ) Notice: Subject to any disclaimer, the term of this patent is extended or adjusted under 35 U.S.C. 154(b) by 14 days.

(21) Appl. No.: 13/088,166

(22) Filed: Apr. 15, 2011

(65) Prior Publication Data

US 2012/0223256 A1  Sep. 6, 2012

Related U.S. Application Data

(60) Provisional application No. 61/464,278, filed on Mar. 2, 2011.

(51) Int. Cl.
*H05G 2/00* (2006.01)

(52) U.S. Cl.
USPC .................................. 250/504 R; 250/493.1

(58) Field of Classification Search
USPC .......................................... 250/493.1, 504 R
See application file for complete search history.

(56) References Cited

U.S. PATENT DOCUMENTS

| | | | |
|---|---|---|---|
| 6,504,903 B1 * | 1/2003 | Kondo et al. | 378/119 |
| 6,972,421 B2 | 12/2005 | Melnychuk | |
| 7,087,914 B2 | 8/2006 | Akins | |
| 7,164,144 B2 | 1/2007 | Partlo | |
| 7,372,056 B2 | 5/2008 | Hemberg et al. | |
| 7,405,416 B2 | 7/2008 | Algots | |
| 7,439,530 B2 | 10/2008 | Ershov | |
| 7,465,946 B2 | 12/2008 | Bowering | |
| 7,491,954 B2 | 2/2009 | Bykanov | |
| 7,655,925 B2 | 2/2010 | Bykanov | |
| 7,705,334 B2 | 4/2010 | Yabuta | |
| 7,812,329 B2 | 10/2010 | Bykanov | |
| 7,843,632 B2 | 11/2010 | Bowering | |
| 7,872,245 B2 | 1/2011 | Vaschenko | |
| 7,897,947 B2 | 3/2011 | Vaschenko | |
| 7,911,598 B2 | 3/2011 | Kraus | |
| 7,928,412 B2 | 4/2011 | Van Herpen | |
| 8,075,732 B2 | 12/2011 | Partlo | |
| 8,256,441 B2 | 9/2012 | Moriya | |

(Continued)

FOREIGN PATENT DOCUMENTS

WO  2011/036248  3/2011

OTHER PUBLICATIONS

PCT International Search Report dated Jun. 15, 2012 from International Application No. PCT/US2012/025963, filed Feb. 21, 2012 (3 pgs).

(Continued)

*Primary Examiner* — Michael Maskell
(74) *Attorney, Agent, or Firm* — Cymer, LLC

(57) ABSTRACT

An extreme-ultraviolet (EUV) light source is described herein comprising an optic; a primary EUV light radiator generating an EUV light emitting plasma and producing a deposit on said optic; and a cleaning system comprising a gas and a secondary light radiator, the secondary light radiator generating a laser produced plasma and producing a cleaning species with the gas.

20 Claims, 4 Drawing Sheets

(56) References Cited

U.S. PATENT DOCUMENTS

| | | | |
|---|---|---|---|
| 2006/0091109 A1* | 5/2006 | Partlo et al. | 216/63 |
| 2006/0255298 A1 | 11/2006 | Bykanov | |
| 2009/0154642 A1* | 6/2009 | Bykanov et al. | 378/34 |
| 2010/0192973 A1* | 8/2010 | Ueno et al. | 134/1.1 |
| 2010/0294953 A1 | 11/2010 | Vaschenko | |
| 2011/0140008 A1 | 6/2011 | Partlo | |

OTHER PUBLICATIONS

Written Opinion from PCT International Search Report dated Jun. 15, 2012 from International Application No. PCT/US2012/025963, filed Feb. 21, 2012 (8 pgs).

* cited by examiner

SYSTEMS AND METHODS FOR OPTICS CLEANING IN AN EUV LIGHT SOURCE

CROSS-REFERENCE TO RELATED APPLICATIONS

This application claims priority to U.S. Provisional Patent Application Ser. No. 61/464,278, filed on Mar. 2, 2011, entitled "SYSTEMS AND METHODS FOR OPTICS CLEANING IN AN EUV LIGHT SOURCE", the entire contents of which are hereby incorporated by reference herein.

FIELD

The present application relates to extreme ultraviolet ("EUV") light sources and their methods of operation. These light sources provide EUV light by creating plasma from a source material. In one application, the EUV light may be collected and used in a photolithography process to produce semiconductor integrated circuits.

BACKGROUND

A patterned beam of EUV light can be used to expose a resist coated substrate, such as a silicon wafer, to produce extremely small features in the substrate. Extreme ultraviolet light (also sometimes referred to as soft x-rays) is generally defined as electromagnetic radiation having wavelengths in the range of about 5-100 nm. One particular wavelength of interest for photolithography occurs at 13.5 nm and efforts are currently underway to produce light in the range of 13.5 nm+/−2% which is commonly referred to as "in band EUV" for 13.5 nm systems.

Methods to produce EUV light include, but are not necessarily limited to, converting a source material into a plasma state that has a chemical element with an emission line in the EUV range. These elements can include, but are not necessarily limited to xenon, lithium and tin.

In one such method, often termed laser produced plasma ("LPP"), the required plasma can be produced by irradiating a source material, for example in the form of a droplet, stream or wire, with a laser beam. In another method, often termed discharge produced plasma ("DPP"), the required plasma can be generated by positioning source material having an EUV emission line between a pair of electrodes and causing an electrical discharge to occur between the electrodes.

As indicated above, one technique to produce EUV light involves irradiating a source material. In this regard, $CO_2$ lasers outputting light at infra-red wavelengths, i.e., wavelengths in the range of about 9 μm to 11 μm, may present certain advantages as a so-called 'drive' laser irradiating a source material in an LPP process. This may be especially true for certain source materials, for example, source materials containing tin. One advantage may include the ability to produce a relatively high conversion efficiency between the drive laser input power and the output EUV power.

For LPP and DPP processes, the plasma is typically produced in a sealed vessel, such as a vacuum chamber, and monitored using various types of metrology equipment. In addition to generating in-band EUV radiation, these plasma processes also typically generate undesirable by-products. The by-products can include out-of-band radiation, high energy source material ions, low energy source material ions, excited source material atoms, and thermal source material atoms produced by source material evaporation or by thermalizing source material ions in a buffer gas. The by-products can also include source material in the form of clusters and microdroplets of varying size and which exit the irradiation site at varying speeds. The clusters and microdroplets can deposit directly onto an optic or 'reflect' from the chamber walls or other structures in the chamber and deposit on an optic.

Unfortunately, some or all of the plasma formation by-products described above can potentially damage or reduce the operational efficiency of one or more optics in the chamber including, but not necessarily limited to, collector mirrors capable of EUV reflection at normal and near normal incidence and/or grazing incidence, the surfaces of metrology detectors and filters, windows used to image the plasma formation process, and the laser input window/lens. The plasma formation by-products may be damaging to the optical elements in a number of ways, including heating them beyond their service temperature, coating them with deposits which reduce light transmission or reflection, and may cause undesirable corrosion or erosion. In addition, plasma formation by-products may penetrate or diffuse into an optic causing damage to the optic's structural integrity or a reduction in optical performance. Deposits can include, but are not necessarily limited to, the source material, contaminates present in the source material, oxides of the source material/contaminates, and organics from chamber components that have not been properly cleaned or that outgas in the vacuum environment.

In some instances, it may be desirable to introduce one or more cleaning species into the chamber to remove deposits from an optic in-situ (i.e., while the optic is in the chamber and under vacuum conditions). In one mechanism, one or more cleaning species can combine with a deposit and form a volatile substance which can then be pumped from the vacuum chamber. For these processes to be efficient, a sufficient quantity of the cleaning species needs to be present at the surface of the deposit and it is generally desirable to quickly pump the volatile substance from the chamber before the volatile substance can decompose and re-deposit debris. Volatile substances in the chamber can also undesirably absorb EUV light. This absorption can reduce EUV light source output and/or efficiency.

During operation, the output beam from an EUV light source may be used by a lithography exposure tool such as a stepper or scanner. These exposure tools may first homogenize the beam from the light source and then impart the beam with a pattern in the beam's cross-section, using, for example, a reflective mask. The patterned beam can then be projected onto a portion of a resist-coated wafer. Once a first portion of the resist-coated wafer (often referred to as an exposure field) has been illuminated, the wafer, the mask or both may be moved to irradiate a second exposure field, and so on, until irradiation of the resist-coated wafer is complete. During this process, the scanner typically requires a so-called burst of pulses from the light source for each exposure field. For example, a typical burst period may last for a period of about 0.5 seconds and include about 20,000 EUV light pulses at a pulse repetition rate of about 40 kHz. The length of the burst period, number of pulses and repetition rate may be selected based on EUV output pulse energy, and to the accumulated energy, or dose, specified for an exposure field. In some cases, pulse energy and/or repetition rate may change during a burst period and/or the burst may include one or more non-output periods.

In this process, sequential bursts may be temporally separated by an intervening period. During some intervening periods, which may last for about a fraction of a second, the exposure tool prepares to irradiate the next exposure field and does not need light from the light source. Longer intervening periods may occur when the exposure tool changes wafers. An even longer intervening period may occur when the exposure tool swaps out a so-called "boat" or cassette which holds a number of wafers, performs metrology, performs one or more maintenance functions, or performs some other scheduled or unscheduled process. Generally, during these intervening periods, EUV light is not required by the exposure tool, and, as a consequence, one, some, or all of these intervening periods may represent an opportunity to remove deposits from one or more optics in the light source chamber.

With the above in mind, Applicants disclose Systems and Methods for Optics Cleaning in an EUV Light Source.

SUMMARY

As disclosed herein, in a first aspect, an extreme-ultraviolet (EUV) light source may comprise: an optic, a primacy EUV light radiator generating an EUV light emitting plasma and producing a deposit on the optic, and a cleaning system comprising a gas and a secondary light radiator, the secondary light radiator generating a laser produced plasma and producing a cleaning species with the gas.

In one embodiment, the primary EUV light radiator is a laser produced plasma and a common laser source generates a laser beam for the primary EUV light radiator laser produced plasma and the secondary light radiator laser produced plasma.

In a particular embodiment, the primary EUV light radiator is selected from the group of EUV light radiators consisting of a laser produced plasma and a discharge produced plasma.

In one implementation, the primary EUV light radiator is a laser produced plasma and a first laser source generates a laser beam for the primary EUV light radiator laser produced plasma, and a second laser source generates a laser beam for the secondary light radiator laser produced plasma.

In a particular implementation, the primary EUV light radiator is a laser produced plasma and the light source further comprises a material delivery system having at least one component that is used to generate source material droplets for the primary EUV light radiator and target material droplets for the secondary light radiator.

In one arrangement, the secondary light radiator comprises a focused laser beam producing breakdown in a gas.

In a particular setup of this aspect, the gas comprises hydrogen and the cleaning species comprises hydrogen radicals.

In one embodiment, the secondary light radiator irradiates material having molecules containing carbon with a laser beam.

In a particular embodiment, the material having molecules containing carbon comprises oil.

In one configuration of this aspect, the primary EUV light radiator plasma and secondary light radiator laser produced plasma are generated in a chamber, the light source further comprising a flow control system directing a flow of gas in the chamber from a first flow pattern during generation of the primary EUV light radiator plasma to a second flow pattern, different from the first flow pattern, during generation of the secondary light radiator laser produced plasma.

In one configuration of this aspect, the primary EUV light radiator plasma and secondary light radiator laser produced plasma are generated in a chamber, the light source further comprising a pressure control system changing gas pressure in the chamber from a first gas pressure during generation of the primary EUV light radiator plasma to a second gas pressure, different from the first gas pressure, during generation of the secondary light radiator laser produced plasma.

In one configuration of this aspect, the primary EUV light radiator plasma and secondary light radiator laser produced plasma are generated in a chamber, the light source further comprising a composition control system, changing gas composition in the chamber from a first gas composition during generation of the primary EUV light radiator plasma to a second gas composition, different from the first gas composition, during generation of the secondary light radiator laser produced plasma.

In another aspect, also disclosed herein, a lithographic apparatus may comprise an exposure device and an extreme-ultraviolet (EUV) light source comprising: an optic, a primary EUV light radiator generating an EUV light emitting plasma and producing a deposit on the optic, and a cleaning system comprising a gas and a secondary light radiator, the secondary light radiator generating a laser produced plasma and producing a cleaning species with the gas.

In another aspect, also disclosed herein, an extreme-ultraviolet (EUV) light source may comprise: an optic, a system generating an EUV light emitting plasma, the EUV light emitting plasma producing a deposit on the optic, and a cleaning system, the cleaning system comprising a gas and generating light having a wavelength below 125 nm, the cleaning system irradiating the deposit with the light having a wavelength below 125 nm to produce a cleaning species with the gas.

In one embodiment of this aspect, the cleaning system comprises a light radiator selected from the group of light radiators consisting of a laser produced plasma light radiator and a discharge produced plasma light radiator.

In a particular embodiment, the cleaning system generates light having a wavelength below 70 nm and irradiates the deposit with the light having a wavelength below 70 nm to produce a cleaning species with the gas.

In another aspect, also disclosed herein, a lithographic apparatus may comprise an exposure device and an extreme-ultraviolet (EUV) light source may comprise: an optic, a system generating an EUV light emitting plasma, the EUV light emitting plasma producing a deposit on the optic, and a cleaning system, the cleaning system comprising a gas and generating light having a wavelength below 125 nm, the cleaning system irradiating the deposit with the light having a wavelength below 125 nm to produce a cleaning species with the gas.

In another aspect, also disclosed herein, a method may comprise the steps of providing an optic, generating an EUV light emitting plasma for substrate exposure during a burst period, the EUV light emitting plasma producing a deposit on the optic, and providing a gas and generating a laser produced plasma to produce a cleaning species with the gas during an intervening period.

In a particular implementation of this aspect, the laser produced plasma to produce a cleaning species with the gas during an intervening period is a first laser produced plasma and the EUV light emitting plasma is a second laser produced plasma, a common material delivery system is used to produce droplets for the first and second laser produced plasmas, and a common laser source is used to irradiate droplets for the first and second laser produced plasmas.

In a particular implementation, the laser produced plasma is generated by irradiating a gas with a focused laser beam.

In one implementation, the chamber conditions during the burst period are different from the chamber conditions during the intervening period.

In a particular implementation, the EUV light emitting plasma for substrate exposure and the laser produced plasma to produce a cleaning specks are generated in a chamber, the method further comprising the steps of directing a flow of gas in the chamber in a first flow pattern during the burst period, and directing a flow of gas in the chamber in a second flow pattern, different from the first flow pattern, during the intervening period.

In a particular implementation, the EUV light emitting plasma for substrate exposure and the laser produced plasma to produce a cleaning species are generated in a chamber, the method further comprising the steps of establishing a first gas pressure in the chamber during the burst period, and establishing a second gas pressure in the chamber, different from the first gas pressure, during the intervening period.

In a particular implementation, the EUV light emitting plasma for substrate exposure and the laser produced plasma to produce a cleaning species are generated in a chamber, the method further comprising the steps of establishing a first gas composition in the chamber during the burst period, and establishing a second gas composition in the chamber, different from the first gas composition, during the intervening period.

In one implementation of this aspect, the EUV light emitting plasma for substrate exposure is a laser produced plasma generated using a pulsed laser and the laser produced plasma to produce a cleaning species is generated using a pulsed laser, the method further comprising the steps of: establishing a first laser pulse pattern during the burst period, and establishing a second laser pulse pattern, different from the first laser pulse pattern, during the intervening period.

DETAILED DESCRIPTION

Figure 1:
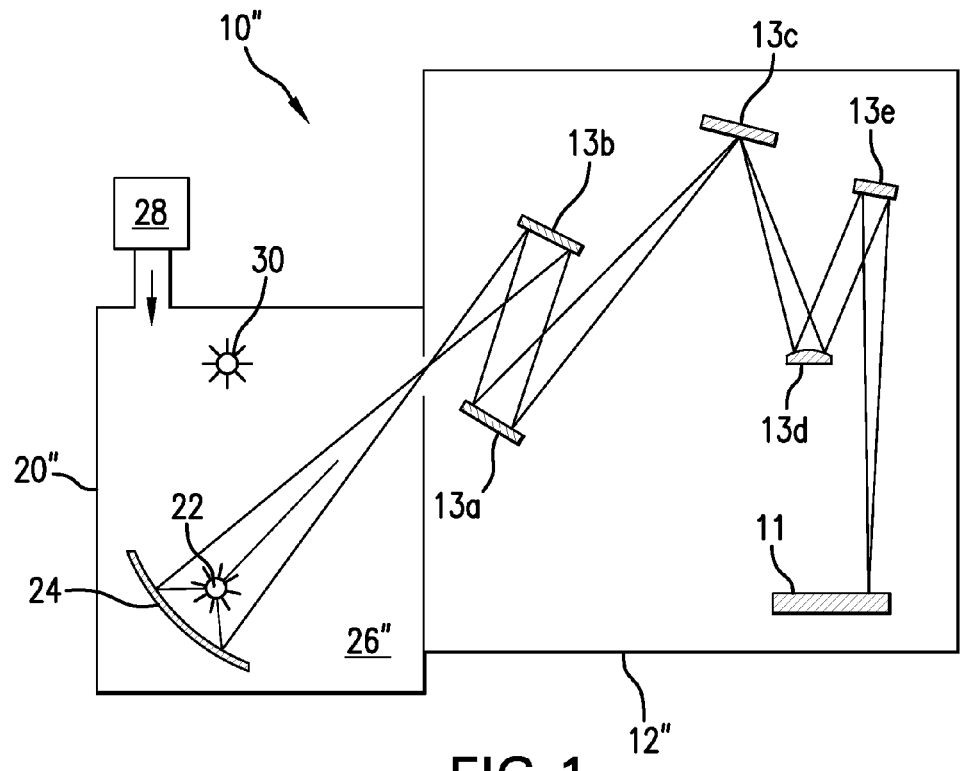
FIG. 1 shows a simplified schematic view of an EUV light source coupled with an exposure device and having an optics cleaning system.

With initial reference to FIG. 1, there is shown a simplified, schematic, sectional view of selected portions of one example of an EUV photolithography apparatus, generally designated 10". The apparatus 10" may be used, for example, to expose a substrate 11 such as a resist coated wafer with a patterned beam of EUV light. For the apparatus 10", an exposure device 12" utilizing EUV light, (e.g., an integrated circuit lithography tool such as a stepper, scanner, step and scan system, direct write system, device using a contact and/or proximity mask, etc. . . . ) may be provided having one or more optics 13a,b, for example, to illuminate a patterning optic 13c with a beam of EUV light, such as a reticle, to produce a patterned beam, and one or more reduction projection optic(s) 13d, 13e, for projecting the patterned beam onto the substrate 11. A mechanical assembly (not shown) may be provided for generating a controlled relative movement between the substrate 11 and patterning means 13c.

As used herein, the term "optic" and its derivatives is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, neither the term "optic" nor its derivatives, as used herein, are meant to be limited to components which operate solely or to advantage within one or more specific wavelength range(s) such as at the EUV output light wavelength, the irradiation laser wavelength, a wavelength suitable for metrology or any other specific wavelength.

As further shown in FIG. 1, the apparatus 10" may include an EUV light source 20". As shown, the EUV light source 20" can include a primary EUV light radiator 22 emitting EUV light in a chamber 26" that is reflected by optic 24 along a path into the exposure device 12" to irradiate the substrate 11. For example, for substrate exposure mode, the primary EUV light radiator 22 may include a discharge produced plasma (DPP) EUV light source (see FIG. 1A), a laser produced plasma (LPP) EUV light source (see FIG. 1B), or any other type of EUV light source known in the pertinent art such as a so-called hybrid system (i.e., system having a laser and an electrical discharge). For example, in one type of hybrid system (not shown), a pair of rotating, wheel-shaped electrodes may be provided, with each electrode partially submerged in a source material bath, e.g., tin bath. A laser may then be focused onto the source material coated wheel to vaporize source material and position source material between the electrodes for subsequent discharge therebetween.

During operation of the apparatus 10", portions or all of the operative optical surfaces of an optic in chamber 26", such as optic 24, may be undesirably coated with material deposit(s) which reduce the operational efficiency of the optic. These deposits can include source material (including source material contaminants), oxygen, water, organics such as hydrocarbons, and other contaminates introduced into the chamber from chamber components such as electrodes (if applicable), metals sputtered from chamber components and walls by plasma produced ions, etc. For example, organics may be introduced from adhesives, seals, insulators, etc., from the droplet generator (if applicable), pumps, metrology equipment, etc. In general, a baking procedure may be employed prior to light source operation to remove organics and some other contaminates, however, this may not be fully effective. Deposits can also include compounds of the materials described above, such as oxides or nitrides of the source material, etc. In addition, the deposits can include reaction products stemming from a reaction between a material constituent found in an optic and a species present in the chamber. For example, a deposit may include an oxide of an MLM capping layer material or a nitride of an MLM layer when a capping layer is not employed, e.g. molybdenum nitride, silicon oxide, etc.

When tin is used as a source material, the by-products of plasma formation may include high energy tin ions, low energy tin ions, excited tin atoms, thermal tin atoms produced by source material evaporation or by way of thermalized ions (when a buffer gas is employed), and tin material in the form of clusters and microdroplets of varying size, and which exit the irradiation site at varying speeds. Material from each of these by-product types may result in a deposit on an optic. Also, particles such as tungsten, titanium, tantalum, iron, nickel chromium, etc., and/or their oxides/nitrides, etc., may be present in the tin, either dissolved or otherwise. These contaminates may be present as trace elements in the tin supply, or may be introduced into the tin from droplet generator components such as the droplet generator reservoir, filters, capillary tubes, etc. These contaminates may also participate in the plasma formation process generating contaminate ions, atoms and/or compounds. The contaminates can also be present in relatively small amounts in the tin clusters/microdroplets, and may ultimately be deposited on an optic surface.

For example, for source materials which include tin, the deposits may include tin, tin oxides, tin hydroxides, water, organics such as hydrocarbons, intermetallic compounds, contaminates described above and their oxides, and nitrides, and organo-tin compounds. Other deposits are possible. It is to be appreciated that each deposit type may respond differently to a particular cleaning species and/or a particular cleaning regimen which may be characterized as having specific cleaning parameters such as cleaning species concentration, temperature, pressure, contact time, etc. Moreover, the presence of one deposit type may affect the response of another deposit type to a particular cleaning regimen. For example, the presence of tin oxides may reduce the etch rate of tin by hydrogen radicals.

FIG. 1 also shows that the apparatus 10" may include a cleaning system for removing deposits from a surface of an optic such as optic 24. The cleaning system may include a gas supply introducing one or more gasses 28 into the chamber 26 and one or more light radiators producing one or more cleaning species from the gas(ses). As detailed further below, the cleaning system light radiator(s) may include one or more secondary light radiators such as the secondary light radiator 30 shown in FIG. 1. The secondary light radiator(s) may be wholly or partly within the chamber 26", may be external to the chamber 26" or may be in another portion of the device 10". Alternatively, as detailed further below, the primary EUV light radiator 22 may be used to generate one or more cleaning species from the gas(ses) 28 during a cleaning mode. The light source 20" may be placed in cleaning mode during an intervening period when in-band EUV light is not needed for substrate exposure by the exposure device 12". In another alternative, both the primary EUV light radiator 22 and a secondary light radiator 30 may be used during an intervening period to generate one or more cleaning species, and/or both the primary EUV light radiator 22 and a secondary light radiator 30 may be used during a substrate exposure period to reduce a deposit accumulation rate for one or more of the depositing materials.

As used herein, the term "cleaning species" and its derivatives is meant to be broadly construed to include, and not necessarily be limited to, any particle such as a atom, excited atom, ion, radical, molecule, or excited molecule that reacts with a surface deposit to create a reaction product that is volatile in the chamber environment and/or catalyzes a reaction between a particle and a surface deposit to create a reaction product that is volatile in the chamber environment.

For example, the gas 28 may include hydrogen molecules which may dissociate (when used with a cleaning system radiator) to produce hydrogen radicals (a cleaning species). The hydrogen radicals may then react with a deposit to form a volatile substance, for example, hydrogen radicals may then react with tin to form a tin hydride ($SnH_4$).

As used herein, the term "hydrogen" and its derivatives is meant to be broadly construed to include, and not necessarily be limited to, isotopes of hydrogen including protium "H", deuterium "D" and/or tritium "T" as atoms, ions, excited atoms, radicals, or in molecules or excited molecules including $H_2$, $D_2$, $T_2$, DH, TH and/or DT.

Other cleaning system gas(ses) may include, but are not necessarily limited to halides such as HBr, HF, HCl, HI, R—Br (where R represents a hydrocarbon chain or ring), R—F, R—Cl, R—I, and halogens such as $Br_2$, $F_2$, $Cl_2$, $I_2$. For example, one or more of these compounds may form a halogen radical, e.g., Cl, (when used with a cleaning system radiator) which form a volatile substance upon reaction with a deposit such as $SnCl_4$.

A buffer gas, such as hydrogen, helium, argon or combinations thereof, may be employed in the chamber 26 to slow ions generated by the primary EUV light radiator. In some cases, one, some or all of the gas(ses) used in the buffer gas may be the same as one, some or all of the cleaning system gas(ses) 28. Thus, in some cases, a common gas supply may be used. For example, hydrogen may be used as both a buffer gas to slow ions generated by the primary EUV light radiator during BUY light production for substrate exposure, and also, as a cleaning system gas for producing a hydrogen radical cleaning species. However, as explained in greater detail below, in some cases a different pressure, gas composition and/or gas flow pattern may be used during a cleaning period than is used during periods when EUV is produced for substrate exposure. For some of these implementations, one or more pumps can be used to partially or fully evacuate the chamber of buffer gas at the onset of a cleaning period and/or partially or fully evacuate the chamber of cleaning system gas at the onset of a period when EUV is produced for substrate exposure. In some implementations, systems producing BUY light for substrate exposure and cleaning systems may be operated simultaneously.

In one setup, one or more secondary light radiators such as the secondary light radiator 30 shown in FIG. 1 may be provided to generate light with a wavelength below about 125 nm. Radiation in the range of about 35 nm to 125 nm is strongly absorbed by hydrogen causing hydrogen photo-dissociation and producing hydrogen radicals. The hydrogen radicals may reach a deposit by diffusion or gas flow transport where they may combine with deposits such as tin producing volatile substances such as tin hydride. In some implementations, light having a wavelength below 125 nm is allowed to irradiate the deposit and/or the surface of the optic and for the gas between the secondary light radiator 30 and optic, without filtration or without filtration in the band of 35 nm to 125 nm.

In a particular setup, one or more secondary light radiators such as the secondary light radiator 30 shown in FIG. 1 may be provided to generate light with a wavelength below about 70 nm. In addition to hydrogen photo-dissociation, radiation with a wavelength below about 70 nm can have an energy exceeding the work function of at least one material in the optic and/or material deposited on the optic by a sufficient amount such that photoelectrons are produced having sufficient energy to react with one or more of the gas(ses) 28 to produce a cleaning species, For example, radiation with a wavelength below about 70 nm can have an energy exceeding the work function of at least one material in the optic and/or material deposited on the optic by a sufficient amount such that photoelectrons are produced having sufficient energy to cause substantial hydrogen dissociation (i.e., photoelectron energy greater than about 15 eV). The resulting hydrogen radicals may be created adjacent to a surface of the optic 24 where they may reach a deposit by diffusion or gas flow transport, and may combine with deposits such as tin producing volatile substances such as tin hydride. For example, the material generating photoelectrons may be molybdenum (work function=4.60 eV) or Silicon (work function=4.52 eV) from a Mo/Si multi-layer mirror, a capping layer such as $Si_3N_4$ (work functions=5.1 eV) or Ruthenium (work functions=4.71 eV), or a deposit such as tin (work function=4.42 eV). In some implementations, light having a wavelength below 70 nm is allowed to irradiate the deposit and/or the surface of the optic and for the gas between the secondary light radiator 30 and optic, without filtration or without filtration below 70 nm.

Examples of secondary light radiators, include, but are not necessarily limited to, laser produced plasma systems, discharge produced plasma systems including capacitively coupled plasma (CCP) systems and inductively coupled plasma (ICP) systems, Microwave produced plasma, arc produced plasma, X-ray tube, X-ray laser, soft x-ray laser, hybrid DPP/laser system (see above), synchrotron, or any other device known in the art to produce light having a wavelength below about 125 nm.

For secondary light radiators producing a plasma, a chemical species may be produced by photo-dissociation (see above), photoelectron-dissociation (see above) ion impact dissociation and/or electron impact dissociation of one or more of the gas(ses) 28. For example, hydrogen molecules may be photo-dissociated, photoelectron-dissociated, ion impact dissociated and/or electron impact dissociated to produce hydrogen radicals. The hydrogen radicals may then react with tin deposits to form a volatile tin compound such as $SnH_4$.

In one setup, the secondary light radiator 30 may be a laser produced plasma light source producing one or more cleaning species when used in conjunction with one or more of the gas(ses) 28. The laser produced plasma may produce one or more cleaning species by: 1) generating photoelectrons (see above), photo-dissociation of the gas(ses) 28 due to interaction between gas particles and photons and/or by interaction between gas particles and plasma produced ions and/or electrons. Other, more complex mechanisms may occur. In some cases (see below), the cleaning species may be generated at a distance from the surface deposits and may diffuse or be caused to flow to the optic surface for reaction with a deposit.

Figure 1A:
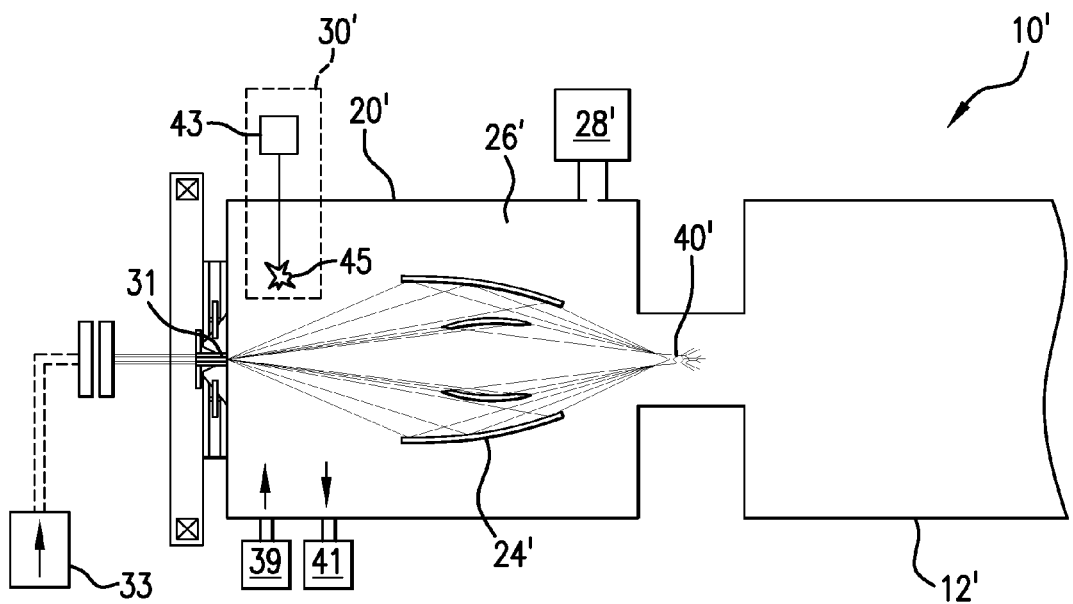
FIG. 1A shows a simplified schematic view of an apparatus having a primary EUV light radiator that is a DPP light source.

FIG. 1A illustrates a specific example of an apparatus 10' having a primary EUV light radiator that is a DPP light source 20'. As shown, the DPP light source 20' may produce EUV light in a chamber 26' that is reflected by optic 24' along a path into the exposure device 12' to irradiate a substrate such as a resist coated wafer (not shown). Also shown, the source 20' may be a so-called dense plasma focus device producing plasma at plasma site in a chamber 26'. Although a dense plasma focus device is shown, it is to be appreciated that other discharge produced plasma (DPP) devices such as a conventional z pinch device, a hollow cathode z-pinch, hybrid (rotating wheel/laser) described above, capillary discharge, etc., may be used.

For the apparatus 10' shown in FIG. 1A, the source 20' may include a pair of electrodes 31 which may be, for example, arranged co-axially. In one setup, the central electrode may be hollow and an active gas 33, such as Xenon, tin vapor, lithium vapor, etc., may be passed through the hollow electrode to the plasma site. The central electrode may then be pulsed by an electrical pulse power system to a relatively high electrical potential relative to the outer electrode. Capacitance values, anode length and shape, and active gas delivery systems may be optimized to increase EUV light output. Also, one or both of the electrodes may be cooled, for example, by circulating water through the electrode wall(s) and/or using a heat pipe cooling system.

FIG. 1A further shows that an optic 24' may be used to collect EUV radiation produced in the plasma and direct the radiation in a desired direction such as toward an intermediate focus 40'. Although two grazing incidence mirrors, arranged in a nested configuration, are shown, it is to be appreciated that more than two and as few as one grazing incidence mirror, may be used. The reflecting surface of each mirror may be made of molybdenum, palladium, ruthenium, rhodium, gold, tungsten, or a multi-layer system such as Mo/Si, for example.

In addition, a buffer gas 39 such as hydrogen, helium, argon or combinations thereof, may be introduced into the chamber 26', as shown, and removed from the chamber 26' via pump 41. The buffer gas is typically present in the chamber 26' during plasma discharge and may act to slow plasma created ions to reduce optic degradation and/or increase plasma efficiency. More details regarding a DPP light source may be found in U.S. Pat. No. 6,972,421 issued on Dec. 6, 2005, and entitled, EXTREME ULTRAVIOLET LIGHT SOURCE, the entire contents of which are hereby incorporated by reference herein.

It can also be seen that the apparatus 10' may include a cleaning system for removing deposits from a surface of an optic 24'. The cleaning system may include a gas source introducing one or more gas(ses) 28' into the chamber 26 and one or more secondary light radiator(s) 30' producing one or more cleaning species from the gas(ses) 28'. For illustrative purposes, the secondary light radiator 30' is shown as a laser produced plasma light radiator having a laser source 43 and a target material, which, when irradiated by a laser beam from the laser source 43, forms a plasma 45. Non-LPP light radiators (described above) may be used for the secondary light radiator.

Suitable target materials for the secondary light radiator 30' include, but are not necessarily limited to tin/materials containing tin (see below), lithium, water as a liquid, solid or vapor, a water solution, helium, neon, argon, xenon, krypton, hydrogen, or combinations thereof. One advantage of using a material such as water, helium, neon, argon, xenon, krypton or hydrogen may be a reduced amount of plasma generated by-products, for example, as compared to using tin. In some cases, a cleaning system target material may be selected to minimize deposits on the surface of the optic or produce a deposit which is easily removed.

Additional suitable materials may include molecules containing carbon such as organic compounds. These compounds may be naturally occurring or synthetic and include, but are not necessarily limited to, oils, alcohols, organic solvents such as benzene, carbon tetrachloride, etc. One advantage of using a material containing carbon is that it may be readily formed into relatively small droplets which may be advantageous because smaller droplets generate lower quantities of plasma produced by-products than larger droplets. As used herein, the term "oil" and its derivatives is to be interpreted broadly to include any substance that is liquid under ambient conditions and is hydrophobic but soluble in organic solvents. In some arrangements, it may be desirable to use non-oxygen containing target materials for the secondary light radiator 30'. For some configurations, oxygen may be detrimental in that it may produce oxide deposits, such as tin oxide, that are hard to remove from an optic. In some cases, oxygen may adversely affect an optic. For example, oxygen may diffuse into a Mo/Si multilayer stack and cause blisters. Examples of non-oxygen containing target materials include silicone-based oil and perfluoro-carbon oil. In some instances, $C_8F_{15}$ or any other $C_{(n)}F_{(2n+2)}$ oils may be used.

The location of the plasma 45 is shown for illustration purposes only. It is to be appreciated that it may be beneficial for the cleaning system plasma to be produced near or at the location where the DPP plasma is produced, at a location along the optical axis of the optic 24', at or near the intermediate focus 40', between two nested mirrors of the optic 24' at a location that is within a line-of-sight with a portion of an optic requiring cleaning or any other location, including locations external to the chamber 26'. For example, it may be desirable to locate the secondary light radiator 30' to produce one or more cleaning species within a gas flow pattern such that the cleaning species is/are transported to a surface of an optic requiring cleaning. Moreover, the location of the cleaning system plasma 45 may be moved from one location to another during a cleaning regimen and/or a plurality of cleaning system plasmas may be generated simultaneously.

Figure 1B:
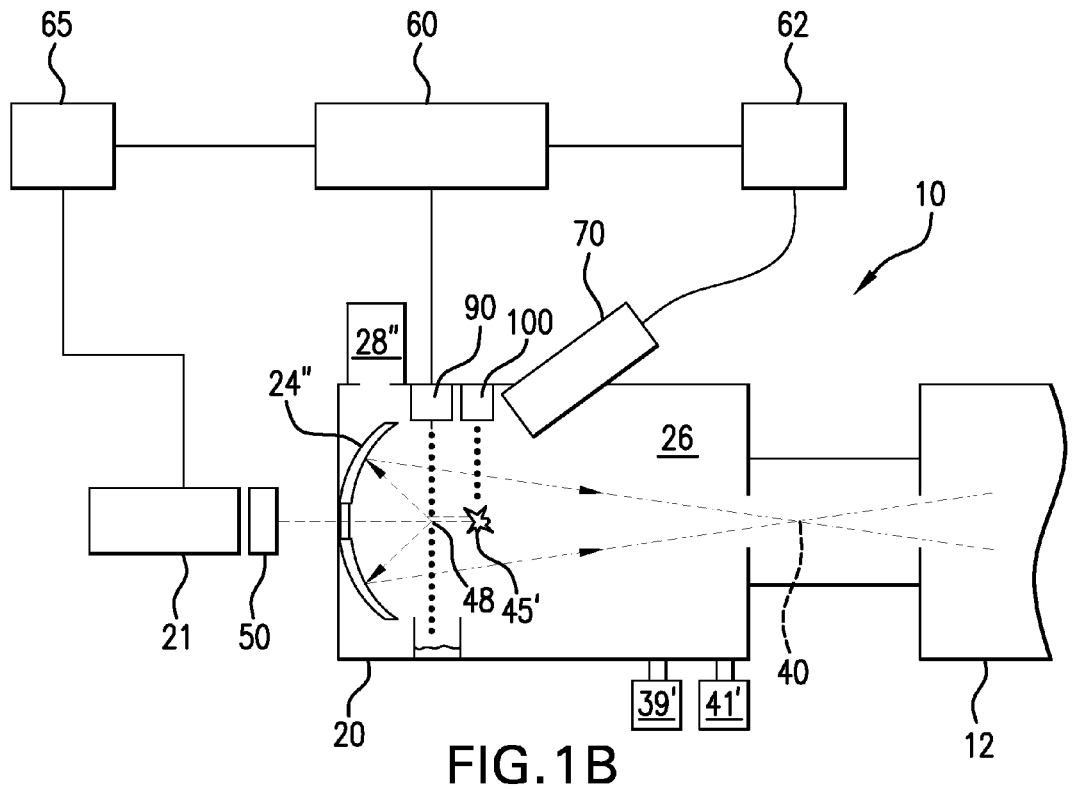
FIG. 1B shows a simplified schematic view of an apparatus that includes an LPP primary EUV light radiator for producing EUV light for substrate exposure and a cleaning system which includes a gas source introducing one or more gas(ses) into a chamber, and a secondary light radiator LPP producing a cleaning species from the gas(ses)

FIG. 1B illustrates another specific example in which an apparatus 10 includes an LPP primary EUV light radiator for producing EUV light for substrate exposure. As shown, the apparatus 10 also includes a cleaning system which may include a gas source introducing one or more gas(ses) 28" into the chamber 26 and a secondary light radiator producing a cleaning species from the gas(ses). For the embodiment shown in FIG. 1B, the secondary light radiator is an LPP system generating plasma 45'.

Continuing with FIG. 1B, a system 21 for generating a train of light pulses and delivering the light pulses into a light source chamber 26 may be provided. For the apparatus 10, the light pulses may travel along one or more beam paths from the system 21 and into the chamber 26 to illuminate source material at an irradiation region 48 to produce an EUV light output for substrate exposure in the exposure device 12.

Suitable lasers for use in the system 21 shown in FIG. 1B, may include a pulsed laser device, e.g., a pulsed gas discharge $CO_2$ laser device producing radiation at 9.3 μm or 10.6 μm, e.g., with DC or RF excitation, operating at relatively high power, e.g., 10 kW or higher and high pulse repetition rate, e.g., 50 kHz or more. In one particular implementation, the laser may be an axial-flow RE-pumped $CO_2$ laser having an oscillator-amplifier configuration (e.g., master oscillator/power amplifier (MOPA) or power oscillator/power amplifier (POPA)) with multiple stages of amplification and having a seed pulse that is initiated by a Q-switched oscillator with relatively low energy and high repetition rate, e.g., capable of 100 kHz operation. From the oscillator, the laser pulse may then be amplified, shaped and/or focused before reaching the irradiation region 48. Continuously pumped $CO_2$ amplifiers may be used for the laser system 21. For example, a suitable $CO_2$ laser device having an oscillator and three amplifiers (O-PA1-PA2-PA3 configuration) is disclosed in U.S. patent application Ser. No. 11/174,299 filed on Jun. 29, 2005, entitled, LPP EUV LIGHT SOURCE DRIVE LASER SYSTEM, now U.S. Pat. No. 7,439,530, issued on Oct. 21, 2008, the entire contents of which are hereby incorporated by reference herein.

Alternatively, the laser may be configured as a so-called "self-targeting" laser system in which the droplet serves as one mirror of the optical cavity. In some "self-targeting" arrangements, an oscillator may not be required. Self-targeting laser systems are disclosed and claimed in U.S. patent application Ser. No. 11/580,414 filed on Oct. 13, 2006, entitled, DRIVE LASER DELIVERY SYSTEMS FOR EUV LIGHT SOURCE, now U.S. Pat. No. 7,491,954, issued on Feb. 17, 2009, the entire contents of which are hereby incorporated by reference herein.

Depending on the application, other types of lasers may also be suitable, e.g., an excimer or molecular fluorine laser operating at high power and high pulse repetition rate. Other examples include, a solid state laser, e.g., having a fiber, rod, slab, or disk-shaped active media, other laser architectures having one or more chambers, e.g., an oscillator chamber and one or more amplifying chambers (with the amplifying chambers in parallel or in series), a master oscillator/power oscillator (MOPO) arrangement, a master oscillator/power ring amplifier (MOPRA) arrangement, or a solid state laser that seeds one or more excimer, molecular fluorine or $CO_2$ amplifier or oscillator chambers, may be suitable. Other designs may be suitable.

In some instances, a source material may first be irradiated by a pre-pulse and thereafter irradiated by a main pulse. Pre-pulse and main pulse seeds may be generated by a single oscillator or two separate oscillators. In some setups, one or more common amplifiers may be used to amplify both the pre-pulse seed and main pulse seed. For other arrangements, separate amplifiers may be used to amplify the pre-pulse and main pulse seeds. For example, the seed laser may be a $CO_2$ laser having a sealed gas including $CO_2$ at sub-atmospheric pressure, e.g., 0.05-0.2 atm, that is pumped by a radio-frequency (RF) discharge. With this arrangement, the seed laser may self-tune to one of the dominant lines such as the 10P(20) line having wavelength 10.5910352 μm. In some cases, Q switching may be employed control seed pulse parameters.

A suitable amplifier for use with a seed laser having a gain media including $CO_2$ described above may include a gain media containing $CO_2$ gas that is pumped by DC or RF excitation. In one particular implementation, the amplifier may include an axial-flow, RF-pumped (continuous or with pulse modulation) $CO_2$ amplification unit. Other types of amplification units having fiber, rod, slab or disk-shaped active media may be used. In some cases, a solid active media may be employed.

The amplifier may have two (or more) amplification units each having its own chamber, active media and excitation source, e.g., pumping electrodes. For example, for the case where the seed laser include gain media, including $CO_2$ described above, suitable lasers for use as amplification units, may include an active media containing $CO_2$ gas that is pumped by DC or RF excitation. In one particular implementation, the amplifier may include a plurality, such as four or five, axial-flow, RF-pumped (continuous or pulsed) $CO_2$ amplification units having a total gain length of about 10-25 meters, and operating, in concert, at relatively high power, e.g., 10 kW or higher. Other types of amplification units having fiber, rod, slab or disk-shaped active media may be used. In some cases, a solid active media may be employed.

FIG. 1B also shows that the apparatus 10 may include a beam conditioning unit 50 having one or more optics for beam conditioning such as expanding, steering, and/or focusing the beam between the laser source system 21 and irradiation site 48.

For example, a steering system, which may include one or more mirrors, prisms, lenses, etc., may be provided and arranged to steer the laser focal spot to different locations in the chamber 26. For example, the steering system may include a first flat mirror mounted on a tip-tilt actuator which may move the first mirror independently in two dimensions, and a second flat mirror mounted on a tip-tilt actuator which may move the second mirror independently in two dimensions. With this arrangement, the steering system may controllably move the focal spot in directions substantially orthogonal to the direction of beam propagation (beam axis).

A focusing assembly may be provided to focus the beam to the irradiation site 48 and adjust the position of the focal spot along the beam axis. For the focusing assembly, an optic such as a focusing lens or mirror may be used that is coupled to an actuator for movement in a direction along the beam axis to move the focal spot along the beam axis.

Further details regarding beam conditioning systems are provided in U.S. patent application Ser. No. 10/803,526, filed on Mar. 17, 2004, entitled A HIGH REPETITION RATE LASER PRODUCED PLASMA EUV LIGHT SOURCE, now U.S. Pat. No. 7,087,914, issued on Aug. 8, 2006; U.S. Ser. No. 10/900,839 filed on Jul. 27, 2004, entitled EUV LIGHT SOURCE, now U.S. Pat. No. 7,164,144, issued on Jan. 16, 2007; and U.S. patent application Ser. No. 12/638,092, filed on Dec. 15, 2009, entitled BEAM TRANSPORT SYSTEM FOR EXTREME ULTRAVIOLET LIGHT SOURCE, the contents of each of which are hereby incorporated by reference.

As further shown in FIG. 1B, the primary EUV light radiator for producing an EUV light output for substrate exposure may also include a source material delivery system 90, e.g., delivering source material, such as tin droplets, into the interior of chamber 26 to an irradiation region 48, where the droplets will interact with one or more light pulses, e.g., zero, one or more pre-pulses and thereafter, one or more main pulses from the system 21, to ultimately produce plasma and generate an EUV emission to expose a substrate such as a resist coated wafer in the exposure device 12. More details regarding various droplet dispenser configurations and their relative advantages may be found in U.S. patent application Ser. No. 12/721,317, filed on Mar. 10, 2010, entitled LASER PRODUCED PLASMA EUV LIGHT SOURCE; U.S. Ser. No. 12/214,736, filed on Jun. 19, 2008, entitled SYSTEMS AND METHODS FOR TARGET MATERIAL DELIVERY IN A LASER PRODUCED PLASMA EUV LIGHT SOURCE; U.S. patent application Ser. No. 11/827,803, filed on Jul. 13, 2007, entitled LASER PRODUCED PLASMA EUV LIGHT SOURCE HAVING A DROPLET STREAM PRODUCED USING A MODULATED DISTURBANCE WAVE; U.S. patent application Ser. No. 11/358,988, filed on Feb. 21, 2006, entitled LASER PRODUCED PLASMA EUV LIGHT SOURCE WITH PRE-PULSE, and published on Nov. 16, 2006 as US2006/0255298A-1; U.S. patent application Ser. No. 11/067,124, filed on Feb. 25, 2005, entitled METHOD AND APPARATUS FOR EUV PLASMA SOURCE TARGET DELIVERY; now U.S. Pat. No. 7,405,416, issued on Jul. 29, 2008; and U.S. patent application Ser. No. 11/174,443, filed on Jun. 29, 2005, entitled LPP EUV PLASMA SOURCE MATERIAL TARGET DELIVERY SYSTEM, now U.S. Pat. No. 7,372,056, issued on May 13, 2008; the contents of each of which are hereby incorporated by reference.

The source material for producing an EUV light output for substrate exposure may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the source material may be presented to the irradiation region at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$. More details concerning the use of these materials in an LPP BUY light source is provided in U.S. patent application Ser. No. 11/406,216, filed on Apr. 17, 2006, entitled ALTERNATIVE FUELS FOR EUV LIGHT SOURCE, now U.S. Pat. No. 7,465,946, issued on Dec. 16, 2008, the contents of which are hereby incorporated by reference herein.

Continuing with reference to FIG. 1B, the apparatus 10 may also include an EUV controller 60, which may also include a drive laser control system 65 for triggering one or more lamps and/or laser devices in the system 21 to thereby generate light pulses for delivery into the chamber 26, and/or for controlling movement of optics in the beam conditioning unit 50. The apparatus 10 may also include a droplet position detection system which may include one or more droplet imagers 70 that provide an output indicative of the position of one or more droplets, e.g., relative to the irradiation region 48. The imager(s) 70 may provide this output to a droplet position detection feedback system 62, which can, e.g., compute a droplet position and trajectory, from which a droplet error can be computed, e.g., on a droplet-by-droplet basis, or on average. The droplet error may then be provided as an input to the controller 60, which can, for example, provide a position, direction and/or timing correction signal to the system 21 to control laser trigger timing and/or to control movement of optics in the beam conditioning unit 50, e.g., to change the location and/or focal power of the light pulses being delivered to the irradiation region 48 in the chamber 26. Also for the EUV light source 20, the source material delivery system 90 may have a control system operable in response to a signal (which in some implementations may include the droplet error described above, or some quantity derived therefrom) from the controller 60, to e.g., modify the release point, initial droplet stream direction, droplet release timing and/or droplet modulation to correct for errors in the droplets arriving at the desired irradiation region 48.

Continuing with FIG. 1B, the apparatus 10 may also include an optic 24" such as a near-normal incidence collector mirror having a reflective surface in the form of a prolate spheroid (i.e., an ellipse rotated about its major axis) having, e.g., a graded multi-layer coating with alternating layers of Molybdenum and Silicon, and in some cases, one or more high temperature diffusion barrier layers, smoothing layers, capping layers and/or etch stop layers. FIG. 1B shows that the optic 24" may be formed with an aperture to allow the light pulses generated by the system 21 to pass through and reach the irradiation region 48. As shown, the optic 24" may be, e.g., a prolate spheroid mirror that has a first focus within or near the irradiation region 48 and a second focus at a so-called intermediate region 40, where the EUV light may be output from the EUV light source 20 and input to an exposure device 12 utilizing EUV light, e.g., an integrated circuit lithography tool. It is to be appreciated that other optics may be used in place of the prolate spheroid mirror for collecting and directing light to an intermediate location for subsequent delivery to a device utilizing EUV light, for example, the optic may be a parabola rotated about its major axis or may be configured to deliver a beam having a ring-shaped cross-section to an intermediate location, see e.g., U.S. patent application Ser. No. 11/505,177, filed on Aug. 16, 2006, entitled EUV OPTICS, the contents of which are hereby incorporated by reference.

A buffer gas 39' such as hydrogen, helium, argon or combinations thereof, may be introduced into the chamber 26, and removed from the chamber 26 via pump 41'. The buffer gas may be present in the chamber 26 during plasma discharge and may act to slow plasma created ions to reduce optic degradation and/or increase plasma efficiency. Alternatively, a magnetic field and/or electric field (not shown) may be used alone, or in combination with a buffer gas, to reduce fast ion damage.

FIG. 1B also shows that the apparatus 10 may include a cleaning system for removing deposits from a surface of an optic 24". The cleaning system may include a gas source 28" introducing one or more gas(ses) into the chamber 26 and one or more secondary light radiators producing a cleaning species from the gas(ses). As described above, in some cases, the secondary light radiators may generate light with a wavelength below 125 nm, and in some cases, below 70 nm.

As described above, the secondary light radiator may produce a cleaning species by generating electrons, photoelectrons, ions, and/or photons for reaction with one or more of the gas(ses) 28".

As further shown in FIG. 1B, the secondary light radiator(s) may be a laser produced plasma light source using some or all of components of the same laser system 21 as the primary EUV light radiator used to produce an EUV output for substrate exposure. For example, the same laser such as a MoPa arrangement may be used for both secondary light radiator(s) and primary EUV light radiator, or separate seed lasers may be used, one for the secondary light radiator(s) and one for the primary EUV light radiator, the outputs of which share a common amplifier, or the system 21 may include different lasers for the secondary light radiator(s) and primary EUV light radiator but combine them together on a common beam path through a common beam conditioner. In some implementations, the laser used for the secondary light radiator(s) may be a so-called "self-targeting" laser system in which the droplet serves as one mirror of the optical cavity while the primary EUV light radiator uses a different arrangement such as a MoPa, and vice versa. The "self-targeting" laser and MoPa laser may share one or more amplifiers.

The output from laser system 21 for use in the primary EUV light radiator for substrate exposure may be the same or different from the laser output used for the secondary light radiator. Laser parameters which may be different for the secondary light radiator and the primary EUV light radiator for substrate exposure include, but are not necessarily limited to, laser wavelength, pulse energy, pulse repetition rate, pulse pattern, pulse duration, pulse shape, intensity at the irradiation region, whether pre-pulsing is employed, and if applicable, the pre-pulse energy, duration, wavelength and delay between pre-pulse and main pulse.

For example, the laser may be operated below its maximum pulse energy for to use in the primary BUY light radiator for substrate exposure to allow flexibility in meeting dose requirements, or on the other hand, the laser may be operated at its maximum pulse energy for use in the secondary light radiator.

As an additional example, the pulse pattern used for the primary EUV light radiator for substrate exposure may consist of bursts of pulses, separated by an intervening period (see description above). As an example, a typical burst may last for a period of about 0.5 seconds and include a continuous train of about 20,000 EUV light pulses at a pulse repetition rate of about 40 kHz. On the other hand, a pulse pattern for the secondary light radiator may be optimized for deposit removal. In one implementation, the pulse pattern may consist of about 2 to 100 pulses at a comfortable repetition rate, e.g. 10-40 kHz, followed by an OFF period, for example, 0.05 milliseconds (ins) to 0.3 ms. The pattern can then be repeated as needed, or as time allows within an intervening period. With this pattern, a cleaning species may be established and allowed to diffuse or flow to the deposit and create a volatile substance. The volatile substance may then be allowed to flow (e.g., in a gas flow) or diffuse away from the deposit during the OFF period without dissociation of the volatile substance by photon, photoelectrons, ions, electrons, etc. Once the volatile substance has traveled from the deposit, it can be flowed out of the chamber or it may be sufficiently distanced from the surface, such that subsequent dissociation of the volatile substance does not result in a redeposition. The above-described pattern may be suitable when hydrogen radicals are used as the cleaning species to remove tin deposits. The number of pulses and the length of the OFF period may be adjusted depending of the expected lifetime of the cleaning species once formed, the rate and direction of gas flows near the deposit and/or the diffusion rate of the volatile substance in the environment near the optic.

Continuing with FIG. 1B, the secondary light radiator may include a target material delivery system 100, e.g., delivering a target material, such as a droplet, into the interior of chamber 26 where the target material will interact with one or more light pulses, e.g., zero, one or more pre-pulses, and thereafter, one or more main pulses from the laser system 21, to ultimately produce plasma 45' and radiate light for generating a cleaning species. The location of the plasma 45' is shown for illustration purposes only. It is to be appreciated that it may be beneficial for the cleaning system plasma to be produced near or at the location where the LPP plasma for substrate exposure is produced, at a location along the optical axis of the optic 24", at or near the intermediate focus 40, at a location that is within a line-of-sight with a portion of an optic requiring cleaning or any other suitable location, for example, a location which may generate a cleaning species which is then transported to a surface of an optic requiring cleaning by diffusion or gas flow. Moreover, the location of the cleaning system plasma 45' may be moved from one location to another during a cleaning period or a plurality of cleaning system plasmas may be generated simultaneously.

When different material delivery systems are employed for the primary and secondary light radiators, as shown in FIG.

1B, one delivery system may generate droplets that are irradiated to produce plasma while the other delivery system continues to deliver droplets that are not irradiated. This allows the delivery systems to continuously produce droplets, whether needed or not, as opposed to starting and stopping a delivery system which can result in clogging unstable streams during startup, etc. For example, in the embodiment shown in FIG. 1B, one droplet stream may be temporally shifted relative to the other allowing the laser to pass through the closer droplet stream (i.e., pass between droplets) and reach droplets in the farther droplet stream. Alternatively, one target material delivery system may be discontinued, deflected or blocked (i.e., with a catch) while the other is irradiated to produce plasma.

The cleaning system gas 28" may include one or more gasses as described above with reference to FIG. 1, to generate a cleaning species (when used with a cleaning system radiator).

A buffer gas 39' (as described above) may be used, and in some cases, one, some, or all of the gas(ses) used in the buffer gas 39' may be the same as one, some, or all of the cleaning system gas(ses) 28".

The target material used in the secondary light radiator may be the same as that used in the primary EUV light radiator (described above) or any of the other target materials described above with reference to FIG. 1A.

In one implementation, the secondary light radiator LPP parameters may be chosen to increase cleaning efficiency of one or more deposit types while the primary EUV light radiator LPP parameters are chosen to optimize in-band EUV output, e.g. 13.5 nm+/−2%.

Target material parameters which may be different for the cleaning system LPP and substrate exposure LPP include, but are not necessarily limited to, target size, e.g., droplet diameter, target composition, target shape, target type (i.e., droplet, wire, continuous stream, solid target, foam, gas jet, gas at elevated pressure for optical gas breakdown (described further below), etc.).

Other system parameters which may be different during operation of the primary EUV light radiator LPP and the secondary light radiator include, but are not necessarily limited to, gas composition in the chamber 26, gas pressure and flow (speed, direction and/or rate of exhaust/replenishment), the temperature of the optic (if the optic is temperature-controlled for example, using a backside heater/cooler).

In use, the apparatus 10 may first be configured for substrate exposure. In this mode, source material delivery system 90 may be operated to deliver droplets of a source material such as tin into the interior of chamber 26 to irradiation region 48 for irradiation by a suitably focused laser beam from system 21. The beam conditioning unit 50 can be configured to properly steer and focus the laser beam 21 to a focal spot at the irradiation region 48. Buffer gas 39' such as hydrogen, helium, argon or combinations thereof, may be introduced into the chamber 26, replenished and exhausted via pump 41', as needed to establish a suitable flow pattern and chamber pressure for EUV output for substrate exposure.

A secondary light radiator LPP may be generated during intervening periods. For example, a secondary light radiator LPP plasma may be generated between substrate exposure bursts, when the exposure tool changes wafers, when the exposure tool swaps out a so-called "boat" or cassette, performs one or more maintenance functions, performs some other scheduled or unscheduled process or according to a cleaning schedule which may dictate cleaning whether the exposure tool requires down time or not.

To configure the apparatus to generate a secondary light radiator LPP during a cleaning period, the target material delivery system 100 may be operated to deliver target material such as water, oil, tin, vapor, etc., into the interior of chamber 26 to for irradiation by a suitably focused laser beam from system 21 to form a plasma 45'. The beam conditioning unit 50 can be configured to properly steer and focus the laser beam 21 to a focal spot at the required location. This may involve a movement of a steering optic and/or focusing optic when transitioning from an BUY output for substrate exposure period to a cleaning period and vice-versa. As indicated above, one or more laser beam parameters may be modified during cleaning mode from the initial settings for substrate exposure mode. In addition, as implied above, one or more gas parameters may be modified using gas source 28", e.g., composition, pressure, flow, etc., from the initial settings for substrate exposure mode. At the end of a cleaning period, the apparatus 10 can be reconfigured with initial settings to produce a substrate exposure LPP. As indicated above, the target material delivery system 90 may continue to operate during cleaning mode and/or the target material delivery system 100 may continue to operate during substrate exposure mode.

Figure 2:
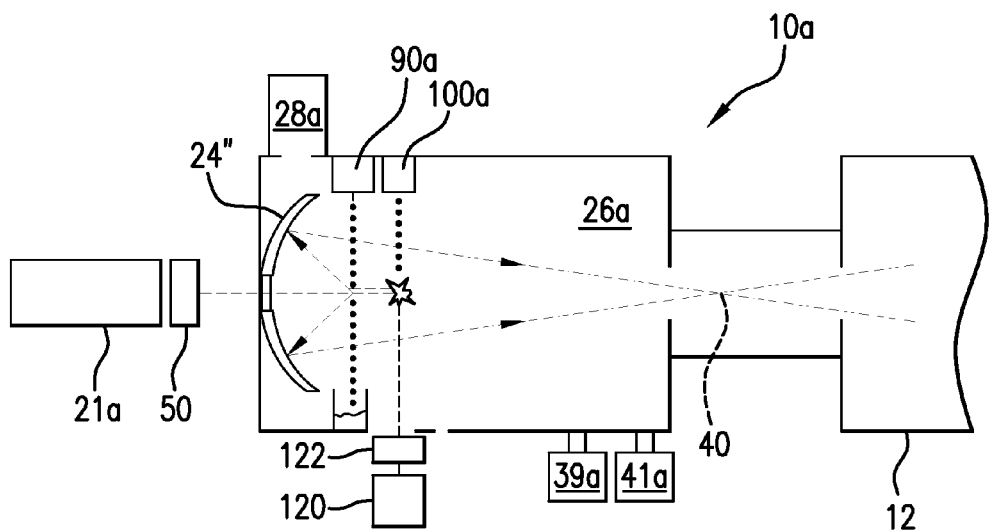
FIG. 2 shows a simplified schematic view of an apparatus including a primary EUV light radiator LPP for producing a substrate exposure and a cleaning system for removing deposits from a surface of an optic including a gas supply introducing one or more gasses into a chamber and a secondary light radiator LPP producing one or more cleaning species from the gas(ses) wherein a common laser system is used for the primary EUV light radiator LPP and secondary light radiator LPP.

FIG. 2 shows an apparatus 10a including a primary EUV light radiator having a laser system 21a for producing a substrate exposure LPP. As shown, the apparatus 10a can include a cleaning system for removing deposits from a surface of an optic such as optic 24". The cleaning system may include a gas supply introducing one or more gasses 28a into the chamber 26a and one or more secondary light radiators producing one or more cleaning species from the gas(ses). For the apparatus 10a, a laser system 120 may be provided to create a cleaning system LPP. For the apparatus 10a shown, the laser systems 21a, 120 may be of the same type, or may be different.

For the case where the laser systems 21a, 120 are of the same type, the lasers may be operated having the same or different laser parameters such as laser wavelength, pulse energy, pulse repetition rate, pulse pattern, pulse duration, pulse shape, intensity at the irradiation region, whether pre-pulsing is employed, and if applicable, the pre-pulse energy, duration, wavelength and delay between pre-pulse and main pulse.

Also shown, a beam conditioning unit 50 may be provided to focus an output beam from the laser system 21a and steer and/or axially move the resulting focal spot within the chamber 26a and a beam conditioning unit 122 may be provided to focus an output beam from the laser system 120 and steer and/or axially move the resulting focal spot within the chamber 26a.

For the apparatus 10a, source material delivery system 90a is provided to generate target material droplets for the primary EUV light radiator LPP for substrate exposure, and a target material delivery system 100a is provided to generate target material droplets for the secondary light radiator LPP. Although different irradiation sites for the substrate exposure LPP and cleaning system LPP are shown in FIG. 2, it is to be appreciated that the same location could be used for both. The target material used for the primary BUY light radiator LPP for substrate exposure may be any of the materials described above, and may be the same or different from the target material used for the secondary light radiator LPP (which may be any of the secondary light radiator LPP target materials identified above). For example, tin may be used for the primary EUV light radiator LPP and water used for the secondary light radiator LPP.

A buffer gas 39a such as hydrogen, helium, argon or combinations thereof, may be introduced into the chamber 26a, replenished and exhausted via pump 41a, as needed. In addition, during a cleaning period (which may occur, for example, during an intervening period), one or more gas parameters may be modified such as the composition, pressure, flow pattern including flow directions and speed, etc., from the parameters used during a substrate exposure period.

Figure 3:
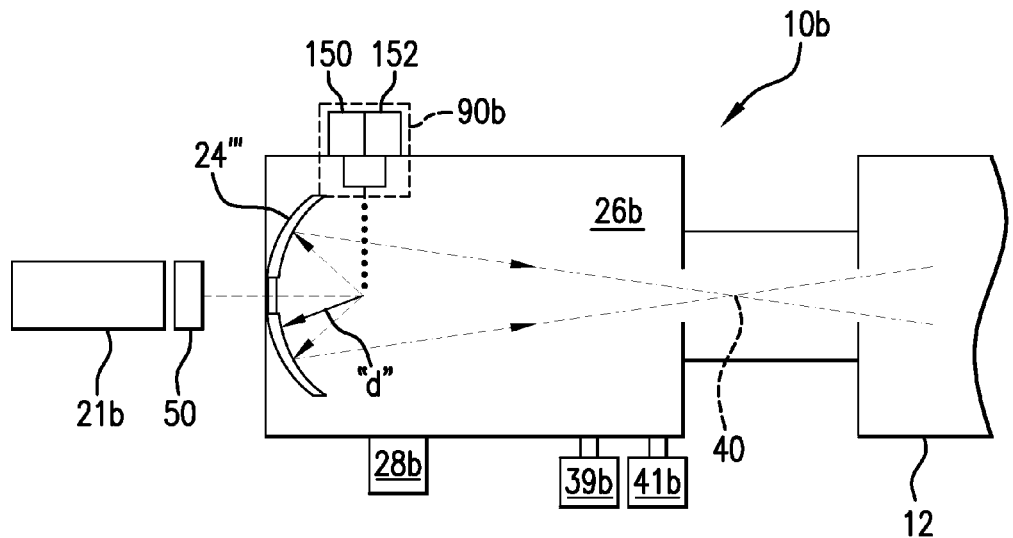
FIG. 3 shows a simplified schematic view of an apparatus including a primary EUV light radiator LPP for producing a substrate exposure and a cleaning system for removing deposits from a surface of an optic including a gas supply introducing one or more gasses into a chamber and a secondary light radiator LPP producing one or more cleaning species from the gas(ses) wherein a common material delivery system is used for the primary EUV light radiator LPP and secondary light radiator LPP.

FIG. 3 shows an apparatus 10 including a primary EUV light radiator having a laser system 21b for producing a substrate exposure LPP. As shown, the apparatus 10b can include a cleaning system for removing deposits from a surface of an optic such as optic 24'''. The cleaning system may include a gas supply introducing one or more gasses 28b into the chamber 26b and one or more secondary light radiators producing one or more cleaning species from the gas(ses). For the apparatus 10b, a material delivery system 90b may be provided that generates both source material droplets for a primary EUV light radiator LPP for substrate exposure, and target material droplets for a secondary light radiator LPP for generating one or more cleaning species. The source material 150 used for the primary EUV light radiator LPP for substrate exposure may be one of the source materials identified above. The target material 152 used for the secondary light radiator LPP may be one of the cleaning system target materials identified above, and may be the same or different from the source material 150. For example, tin may be used for the primary EUV light radiator LPP for substrate exposure, and water or oil may be used for the secondary light radiator LPP. In another example, relatively small tin droplets may be used for the primary EUV light radiator LPP for substrate exposure and relatively large tin droplets used for the secondary light radiator LPP, for example, capillaries of a different size may be used.

In more detail, one or more components of a droplet generator may be employed in the production of both primary EUV light radiator LPP droplets and secondary light radiator LPP droplets. For example, the droplet generator may consist of one or more reservoirs, capillary tubes, piezoelectric modulators, signal generators, various timing and control circuits, which may, for example, synchronize the droplet generator with laser source 21b, and a translation system for selectively moving a droplet generator release point. In perhaps the simplest configuration, both the source material and target material may be sequentially passed through a common capillary tube. In another implementation, separate modules with each module having a reservoir, capillary tube and piezoelectric modulator may be swapped-out (to transition from a substrate exposure period to a cleaning period, and vice-versa) of a common base having a signal generator, timing and control circuits, and a translation system. In another implementation, a complete cleaning system or target material delivery system may be swapped-out with a complete substrate exposure source material delivery system using the same vacuum chamber port to transition from a substrate exposure mode to a cleaning mode, and vice-versa. Other arrangements are possible.

For the arrangement shown in FIG. 3, a common laser system 21b may be used to irradiate both primary EUV light radiator LPP droplets and secondary light radiator LPP droplets. For the apparatus 10b, the laser may be operated having the same laser parameters for both primary EUV light radiator LPP and secondary light radiator LPP, or the parameters may be different for primary EUV light radiator LPP and secondary light radiator LPP. Laser parameters that may differ can include laser wavelength, pulse energy, pulse repetition rate, pulse pattern, pulse duration, pulse shape, intensity at the irradiation region, whether pre-pulsing is employed, and if applicable, the pre-pulse energy, duration, wavelength and delay between pre-pulse and main pulse.

Alternatively, separate lasers as shown in FIG. 2 and described above, may be used with the material delivery system 90b of FIG. 3. A buffer gas 39b such as hydrogen, helium, argon or combinations thereof, may be introduced into the chamber 26b, replenished and exhausted via pump 41b, as needed. In addition, during a cleaning period (which may occur, for example, during an intervening period), one or more gas parameters may be modified from the parameters used during a substrate exposure period such as the composition, pressure, flow pattern including flow directions and speed, etc.

Figure 4:
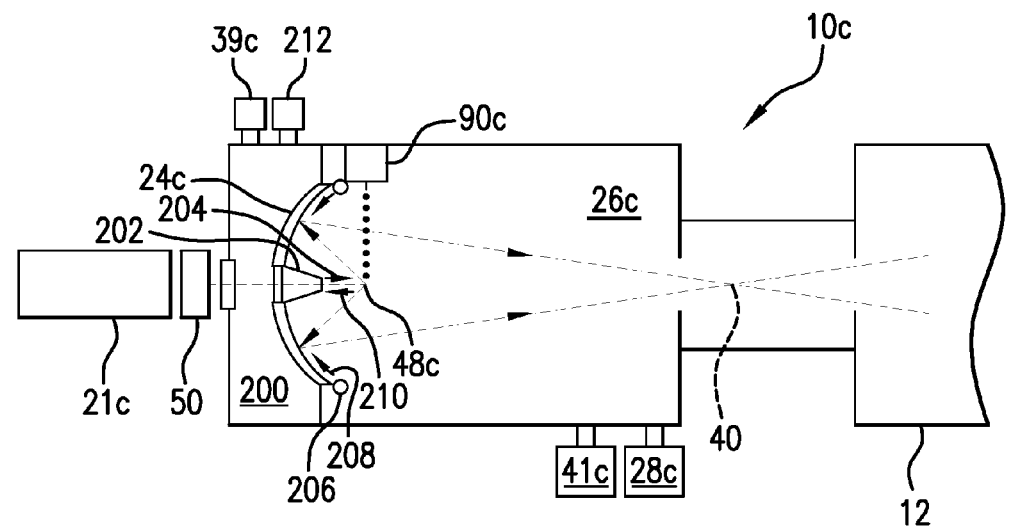
FIG. 4 shows a simplified schematic view of an apparatus including a primary EUV light radiator LPP for producing a substrate exposure, and a cleaning system for removing deposits from a surface of an optic, including a gas supply introducing one or more gasses into a chamber, and a secondary light radiator LPP producing one or more cleaning species from the gas(ses), wherein a common laser system and a common material delivery system are used for the primary EUV light radiator LPP and secondary light radiator LPP.

FIG. 4 shows an apparatus 10e including a primary EUV light radiator LPP for substrate exposure and a cleaning system for removing deposits from a surface of an optic, such as optic 24c. The cleaning system may include a gas supply introducing one or more gasses 28c into the chamber 26c, and one or more secondary light radiators producing one or more cleaning species from the gas(ses). As shown, the apparatus 10c may use both a common material delivery system 90c and a common laser system 21c to generate both the primary EUV light radiator LPP for producing a substrate exposure and secondary light radiator LPP for cleaning.

For the apparatus 10c shown in FIG. 4, the source material used for the primary EUV light radiator LPP for substrate exposure may be of the same composition as the target material used for the secondary light radiator LPP (which may be one of the source materials or target materials identified above). However, the droplet size and/or repetition rate may be different for the primary EUV light radiator LPP for substrate exposure, and the secondary light radiator LPP for generating a cleaning species. This change may be achieved, for example, by changing the pusher gas pressure used to force the droplet material through a capillary and/or by changing the modulation signal used to deform the capillary and produce droplets.

For the apparatus 10c shown in FIG. 4, the laser output used to irradiate source material for the primary EUV light radiator LPP for substrate exposure may be different than the laser output used to irradiate target material for the secondary light radiator LPP. Specifically, laser parameters which may be different for the secondary light radiator and the primary EUV light radiator for substrate exposure include, but are not necessarily limited to, laser wavelength, pulse energy, pulse repetition rate, pulse pattern, pulse duration, pulse shape, intensity at the irradiation region, whether pre-pulsing is employed, and if applicable, the pre-pulse energy, duration, wavelength and delay between pre-pulse and main pulse.

For the apparatus 10c shown in FIG. 4, the source material and target material may be the same, and the laser beam parameters used for the primary EUV light radiator LPP for substrate exposure, may be the same as the beam parameters used for the secondary light radiator LPP. In this case, other system parameters such as chamber conditions may differ.

For the apparatus 10c shown in FIG. 4, the chamber conditions used during a substrate exposure period (i.e., while the laser beam is irradiating source material for the primary EUV light radiator LPP) may be different than the chamber conditions used during a cleaning period (i.e., while the laser beam is irradiating target material for the secondary light radiator LPP). Specifically, the chamber conditions which may be different for a cleaning period than for a substrate exposure period, may include, but are not necessarily limited to, gas composition in the chamber 26c, gas pressure and gas flow (speed, direction and/or rate of exhaust/replenishment). As indicated above, these "chamber conditions" may differ between a substrate exposure period and a cleaning period, such as an intervening period for the embodiments shown in FIGS. 1, 1A, 1B, 2 and 3.

Generally, for the apparatus 10e shown in FIG. 4, there may be at least one laser parameter difference or source material/target material difference or chamber condition difference during a cleaning period than during a substrate exposure period.

As shown in FIG. 4, in one implementation, a buffer gas 39c such as hydrogen, helium, argon or combinations thereof, may be introduced initially and/or replenished (as needed) into a compartment 200 for flow through a gas shroud 202 and into the chamber 26e in the direction of arrow 204. The buffer gas can be exhausted via pump 41c, as needed. Although one pump 41c is shown, it is to be appreciated that more than one pump 41c may be used. Also, unless otherwise specified, the location of the gas inlets and pumps are shown for example only and may be moved to achieve different flow rates and/or flow patterns, as desired. Additionally, as shown, a manifold 206 may be provided to introduce a tangential surface flow (i.e., in the direction of arrow 208) of buffer gas (and/or cleaning gas as described below) along the face of the optic 24c. With this arrangement, a flow of buffer gas flowing generally from the optic 24c and toward the irradiation region 48c may be provided. Flow in this direction during substrate exposure LPP may reduce the transport of plasma generated debris from the irradiation region 48c to the optic 24c. In addition, the exhaustion/replenishment of buffer gas may be used to control temperature, e.g., remove heat in the chamber 26c or cool one or more components or optics in the chamber 26c. In one arrangement, for an optic 24c distanced from the irradiation region 48c by a closest distance, d; (see e.g., FIG. 3), a buffer gas may be caused to flow between the substrate exposure LPP plasma and optic 24c to establish a gas number density sufficient to operate over the distance, d, to reduce the ion energy of plasma generated ions to below about 100 eV before the ions reach the optic 24c. This may reduce or eliminate damage of the optic 24c due to plasma generated ions.

For a cleaning period, one or more gas parameters may be modified such as gas composition, pressure, flow, etc., from the initial settings used during a substrate exposure period. For example, cleaning gas (which may be of the same composition as the buffer gas, or different), may be initially introduced (and replenished as needed) into the chamber 26c for flow through gas shroud 202 and into the compartment 200 in the direction of arrow 210. The cleaning gas can be exhausted via pump 41c, as needed. Additionally, as shown, a manifold 206 may be provided to introduce a surface flow (i.e., across the face of the optic 24c in the direction of arrow 208) of cleaning gas onto the optic 24c. With this arrangement, a flow of cleaning gas flowing generally from the irradiation region 48c and toward the optic 24c, may be provided. Flow in this direction during cleaning system LPP may increase the flow and/or diffusion of cleaning species, e.g., cleaning species created due to photo-dissociation, ion dissociation and/or electron dissociation) to the surface of the optic 24c. For example, this flow arrangement may be used for implementation in which the cleaning LPP generates less thermal atoms such as vapor, or a less deleterious plasma by-product, than the substrate exposure LPP. This may be due to parameter selection, such as target material size, composition, plasma rep rate, etc. For example, if water, xenon, hydrogen, oil, etc., is used for the cleaning system LPP, and tin for substrate exposure LPP, flow during cleaning that is toward the optic 24c and toward the plasma during substrate exposure LPP may be prescribed. Flow toward the optic 24c may be desirable, for example, if the volatile cleaning reaction product has a relatively small photo-dissociation cross section, thus, the probability of re-deposition is low. A pump 212, such as a turbopump or roots blower may be provided to exhaust cleaning gas from compartment 200, as needed. Cleaning gas may also be exhausted, as needed, from chamber 26c. For the case where the volatile cleaning reaction product has a relatively large photo-dissociation cross-section such as $SnH_4$, flow away from the optic 24c, may be desirable to reduce re-deposition.

In some instances, exhausted cleaning gas may be recycled back into the apparatus 10c. For example, a closed loop flow system (not shown) may be employed to route exhausted gas back into the apparatus. The closed loop may include one or more filters, heat exchangers, decomposers, e.g., tin hydride decomposers, and/or pumps). More details regarding closed loop flow paths can be found in U.S. Pat. No. 7,655,925, issued on Feb. 2, 2010, entitled GAS MANAGEMENT SYSTEM FOR A LASER-PRODUCED-PLASMA EUV LIGHT SOURCE; and in Application Number PCT/EP10/64140, filed on Sep. 24, 2010, entitled SOURCE COLLECTOR APPARATUS LITHOGRAPHIC APPARATUS AND DEVICE MANUFACTURING METHOD, the contents of each of which are hereby incorporated by reference herein.

In some cases, the atmosphere in the chamber 26c may be maintained at a different pressure for cleaning mode than for substrate exposure mode. As indicated above, the pressure for substrate exposure mode may be selected to ensure energetic ions are slowed before reaching and damaging the optic 24c. On the other hand, excess pressure during substrate exposure mode may lead to undesirable EUV absorption.

In some implementations, the atmosphere in the chamber 26c may be maintained at a higher pressure during a cleaning period than during a substrate exposure period. This may be desirable to lower fast ion damage, increase the concentration of cleaning species generated and/or increase plasma production when a gas is used as the target material. On the other hand, for some arrangements the atmosphere in the chamber 26c may be maintained at the same or a lower pressure during a cleaning period than during a substrate exposure period. This may be desirable to increase the dissociation volume, (i.e., photo-dissociation, ion-dissociation and/or electron dissociation), to increase diffusion of a cleaning species to the optic surface, and/or to reduce absorption and thereby increase the amount of light reaching the optic to produce photoelectrons. Pressure selection may depend on a number of factors including laser parameters selected, the target material parameters selected, the cleaning system plasma location and other system parameters.

Figure 5:
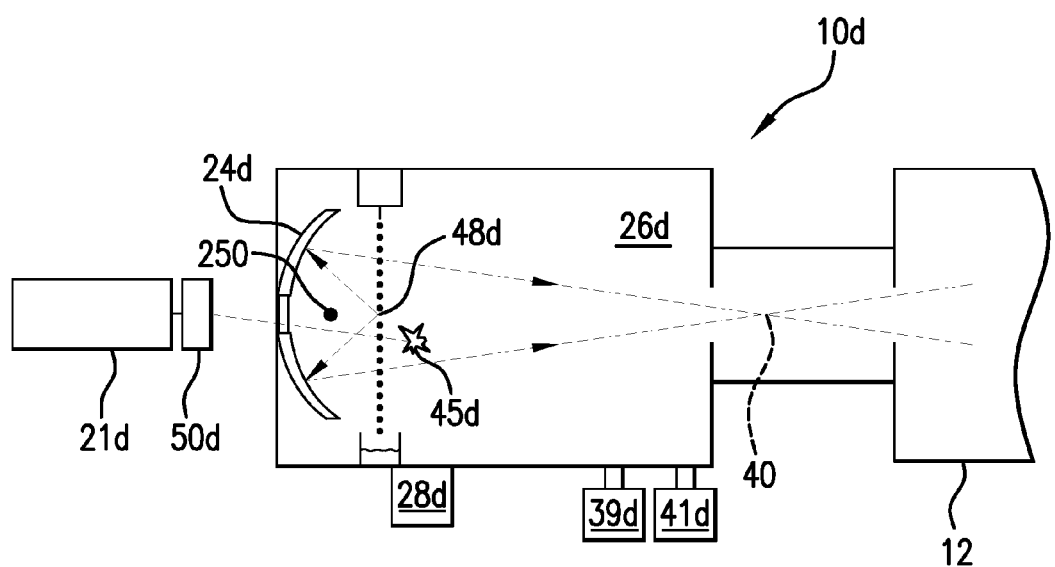
FIG. 5 shows a simplified schematic view of an apparatus including a primary EUV light radiator LPP for producing a substrate exposure and a cleaning system for removing deposits from a surface of an optic including a gas supply introducing one or more gasses into a chamber, and a secondary light radiator LPP producing one or more cleaning species from the gas(ses), wherein the secondary light radiator may be a laser produced plasma (LPP) that is generated by irradiating a gas/vapor at a sufficient intensity to produce a laser induced gas breakdown.

FIG. 5 shows an apparatus 10d including a primary EUV light radiator LPP for substrate exposure and a cleaning system for removing deposits from a surface of an optic, such as optic 24d. The cleaning system may include a gas supply introducing one or more gasses 28d into the chamber 26d and one or more secondary light radiators producing one or more cleaning species from the gas(ses). As shown, the secondary light radiator may be a laser produced plasma (LPP) that is generated by irradiating a gas/vapor in the chamber 26d.

As shown, for this arrangement, a concentrated stream or jet of gas/vapor that is directed to the secondary light radiator LPP location 45d is not necessarily required. Instead, as shown, the output of laser system 21d (or another laser system—see e.g., FIG. 2) may be focused/steered using beam conditioning unit 50d on a gas/vapor in the chamber 26d at a sufficient intensity to produce a laser induced gas breakdown producing a laser induced spark and/or a plasma. When a second laser is used, the primary EUV light radiator LPP and secondary light radiator LPP may be produced simultaneously, contemporaneously or in an alternating manner. Generally, the gas breakdown threshold decreases with increasing laser wavelength and at higher gas pressures. The secondary light radiator LPP may be generated at location 45*d* as shown, at the substrate exposure irradiation region 48*d*, at a location 250 that is closer to the optic 24*d* than the irradiation region or at another suitable location (see above).

For this arrangement, the buffer gas 39*d* employed during substrate exposure LPP may be irradiated to produce the cleaning system LPP. The gas may be flowing or non-flowing during irradiation. Other species in the buffer gas, such as source material vapor or cleaning products, may contribute to plasma formation. For example, tin vapor and/or tin hydride, if present, may participate.

Alternatively, for use during a cleaning period, the composition, pressure and/or flow of the buffer gas may be modified, in whole or in part, from the gas used during a substrate exposure period by introducing (gas(es) 28*d*) and/or exhausting (pump 41*d*) gas from the chamber 26*d*. In another implementation, the buffer gas may be removed, in whole or in part, and a different cleaning system gas may be introduced. The gas used to produce the secondary light radiator LPP may differ from the gas used to produce the cleaning species.

For example, a first gas/vapor such as Ar, Kr, Xe, He, Ne, $H_2$, $H_2O$, $N_2$, a metal hydride ($Me_xH_y$) or combinations thereof, may be introduced in the chamber and be present at the site of the secondary light radiator LPP and a second gas, such as hydrogen or one of the other cleaning gasses described above, may be introduced near the optic 24*d* to produce a cleaning species such as hydrogen radicals near the surface of the optic 24*d*, using, for example, the manifold 206 shown in FIG. 4.

Use of an inert gas for producing the cleaning system LPP may be desirable due to the chemical inertness of inert gases.

In one setup, a $CO_2$ laser focus size of about 50-100 μm may be used to produce breakdown in gases such as Ar, Kr or Xe at atmospheric pressure with a pulse energy of a few tens of mJ (with pulse duration of ~100 ns or shorter). The intense UV radiation from the laser produced plasma can be used to burn-in organic contaminations inside the vacuum vessel (chamber 26*d*).

In addition to use in the cleaning system, the laser induced spark, as described for the apparatus 10*d*, can be used to calibrate metrology cameras to the primary focus of the optic 24*d*. Specifically, the position of the primary focus can be determined by the minimum size of the laser induced plasma, by looking at the size of spark image in the intermediate focus 40 plane with the energy of the laser pulses set close to the gas breakdown threshold.

It will be understood by those skilled in the art that the embodiments described above are intended to be examples only and are not intended to limit the scope of the subject matter which is broadly contemplated by the present application. It is to be appreciated by those skilled in the art that additions, deletions and modifications may be made to the disclosed embodiments within the scope of the subject matter disclosed herein. The appended claims are intended in scope and meaning to cover not only the disclosed embodiments but also such equivalents and other modifications and changes that would be apparent to those skilled in the art. Unless explicitly stated otherwise, reference to an element in the following Claims in the singular or a reference to an element preceded by the article "a" is intended to mean "one or more" of said element(s). None of the disclosure provided herein is intended to be dedicated to the public regardless of whether the disclosure is explicitly recited in the Claims.

We claim:

1. An extreme ultraviolet (EUV) light source comprising;
   a chamber;
   an optic;
   a primary EUV light radiator generating in said chamber using first target material droplets an EUV light emitting plasma and producing a deposit on said optic; and
   a cleaning system comprising a gas and a secondary light radiator, said secondary light radiator generating in said chamber a laser produced plasma from second target material droplets different from said first target material droplets and producing a cleaning species with the gas, said second light radiator employing a second laser source that is different from a first laser source employed by said primary EUV light radiator to produce said EUV light emitting plasma.

2. The light source as recited in claim 1 wherein the primary EUV light radiator is a laser produced plasma.

3. The light source as recited in claim 1 wherein the primary EUV light radiator is selected from the group of EUV light radiators consisting of a laser produced plasma and a discharge produced plasma.

4. The light source as recited in claim 1 wherein the primary EUV light radiator is a laser produced plasma and said first laser source generates a laser beam for the primary EUV light radiator laser produced plasma and said second laser source generates a laser beam for the secondary light radiator laser produced plasma.

5. The light source as recited in claim 1 wherein the primary EUV light radiator is a laser produced plasma and said light source further comprises a material delivery system having at least one component that is used to generate said first source material droplets for said primary EUV light radiator and said second target material droplets for said secondary light radiator.

6. The light source as recited in claim 1 wherein the secondary light radiator comprises a focused laser beam producing breakdown in a gas.

7. The light source as recited in claim 1 wherein said gas comprises hydrogen and said cleaning species comprises hydrogen radicals.

8. The light source as recited in claim 1 wherein said first target material droplets include molecules containing carbon with a laser beam.

9. The light source as recited in claim 8 wherein the material having molecules containing carbon comprises oil.

10. An extreme-ultraviolet (EUV) light source comprising:
    a chamber;
    an optic;
    a system generating in said chamber an EUV light emitting plasma using target material droplets provided by a first material delivery system, the EUV light emitting plasma producing a deposit on said optic; and
    a cleaning system, the cleaning system comprising a gas and generating in said chamber, using target material droplets provided by a second material delivery system that is different from said first material delivery system, light having a wavelength below 125 nm, the cleaning system irradiating said deposit with said light having a wavelength below 125 nm to produce a cleaning species with said gas.

11. The light source as recited in claim 10 wherein the cleaning system comprises a light radiator selected from the group of light radiators consisting of a laser produced plasma light radiator and a discharge produced plasma light radiator.

12. The light source as recited in claim 10 wherein the cleaning system generates light having a wavelength below 70 nm and irradiates said deposit with said light having a wavelength below 70 nm to produce a cleaning species with said gas.

13. A method comprising the steps of:
providing a chamber;
providing an optic;
generating from first target material droplets in said chamber an EUV light using a primary EUV light generator emitting plasma for substrate exposure during a burst period, the EUV light emitting plasma producing a deposit on said optic; and
providing a gas and generating using a secondary light generator in said chamber using second target material droplets different from said first target material droplets a laser produced plasma to produce a cleaning species with the gas during an intervening period, said secondary light radiator employing a second laser source that is different from a first laser source employed by said primary EUV light radiator to produce said EUV light emitting plasma.

14. The method as recited in claim 13 wherein the laser produced plasma is generated by irradiating a gas with a focused laser beam.

15. The method as recited in claim 13 wherein chamber conditions during the burst period are different from chamber conditions during the intervening period.

16. The method as recited in claim 13 further comprising the steps of;
directing a flow of gas in the chamber in a first flow pattern during said burst period; and
directing a flow of gas in the chamber in a second flow pattern, different from the first flow pattern, during said intervening period.

17. The method as recited in claim 13 further comprising the steps of:
establishing a first gas pressure in said chamber during said burst period; and
establishing a second gas pressure in said chamber, different from the first gas pressure, during said intervening period.

18. The method as recited in claim 13 further comprising the steps of:
establishing a first gas composition in said chamber during said burst period; and
establishing a second gas composition in said chamber, different from the first gas composition, during said intervening period.

19. The method as recited in claim 13 wherein said EUV light emitting plasma for substrate exposure is a laser produced plasma generated using a pulsed laser and said laser produced plasma to produce a cleaning species is generated using a pulsed laser, the method further comprising the steps of:
establishing a first laser pulse pattern during said burst period; and
establishing a second laser pulse pattern, different from the first laser pulse pattern, during said intervening period.

20. An extreme ultraviolet (EUV) light source comprising;
a chamber;
an optic;
a primary EUV light radiator generating in said chamber using target material droplets an EUV light emitting plasma and producing a deposit on said optic; and
a cleaning system comprising a gas and a secondary light radiator, said secondary light radiator generating in said chamber a laser produced plasma and producing a cleaning species with the gas, said second light radiator employing a second laser source that is different from a first laser source employed by said primary EUV light radiator to produce said EUV light emitting plasma, wherein said light source further comprises a first material delivery system having at least one component that is used to generate source material droplets for said primary EUV light radiator and a second material delivery system different from said first material delivery system, said second material delivery system having at least one component that is used to generate source material droplets for said secondary light radiator.

* * * * *